(12) United States Patent
Chang et al.

(10) Patent No.: US 6,303,419 B1
(45) Date of Patent: Oct. 16, 2001

(54) METHOD FOR FABRICATING A BICMOS DEVICE FEATURING TWIN WELLS AND AN N TYPE EPITAXIAL LAYER

(75) Inventors: Kuan-Lun Chang, Chutung Hsinch; Bing-Yue Tsui, Hsinchu, both of (TW)

(73) Assignee: Industrial Technology Research Institute, Hsin-Chu (TW)

( * ) Notice: Subject to any disclaimer, the term of this patent is extended or adjusted under 35 U.S.C. 154(b) by 0 days.

(21) Appl. No.: 09/534,165

(22) Filed: Mar. 24, 2000

(51) Int. Cl.[7] .................................................. H01L 21/8238
(52) U.S. Cl. ........................... 438/202; 438/234; 438/324; 438/365
(58) Field of Search ..................................... 438/202, 203, 438/204, 205, 234, 309, 365, 324

(56) References Cited

U.S. PATENT DOCUMENTS

| 5,102,811 | 4/1992 | Scott . | |
|---|---|---|---|
| 5,543,653 | 8/1996 | Grubisich | 257/593 |
| 5,776,807 | 7/1998 | Ronkainen et al. | 438/202 |
| 5,953,600 | * 9/1999 | Gris | 438/200 |
| 6,093,613 | * 7/2000 | Verma et al. | 438/309 |
| 6,100,124 | * 8/2000 | Iwamoto | 438/202 |
| 6,103,560 | * 8/2000 | Suzuki | 438/202 |
| 6,218,253 | * 4/2001 | Kishi | 438/309 |

* cited by examiner

Primary Examiner—Tuan H. Nguyen
(74) Attorney, Agent, or Firm—George O. Saile; Stephen B. Ackerman

(57) ABSTRACT

A process for fabricating a BiCMOS device, on a semiconductor substrate, featuring PFET and NFET devices, and an NPN bipolar junction transistor, has been developed. The process features the integration, or the sharing of process steps, used for both the CMOS and bipolar devices, such as the creation of an N type buried layer, used in one region for isolation of PFET devices, and used in a second region, of the semiconductor substrate, as a subcollector region, for the bipolar device. Features of the BiCMOS process include the formation of N well, and P well regions, for CMOS device, as well as the use of an epitaxial silicon layer, to allow optimum bipolar characteristics to be achieved.

29 Claims, 12 Drawing Sheets

METHOD FOR FABRICATING A BICMOS DEVICE FEATURING TWIN WELLS AND AN N TYPE EPITAXIAL LAYER

BACKGROUND OF THE INVENTION (1) Field of the Invention

The present invention relates to processes used to fabricate semiconductor devices, and more specifically to a process used to fabricate a bipolar—complimentary metal oxide semiconductor, (BiCMOS), device, on a semiconductor substrate.

(2) Description of Prior Art

The addition of bipolar junction transistors, to CMOS designs, results in a BiCMOS device, superior in performance to CMOS counterparts, as a result of the inclusion of the higher performing bipolar junction devices. An objective of the semiconductor industry has been to develop a process fabrication sequence, that allows integration of the bipolar, and CMOS devices, using shared process steps, and without sacrificing the performance of the bipolar junction transistor, as a result of having to use basically CMOS materials and processes.

This invention will describe a process for fabricating a BiCMOS device, in which a novel twin well, and epitaxial silicon layer, are featured, to arrive at a BiCMOS chip, formed using many shared, (bipolar and CMOS), process steps, and formed using an N type epitaxial layer, at a concentration, that allows the bipolar device, to achieve the desired performance requirements. Prior art, such as Ronkainen et al, in U.S. Pat. No. 5,776,807, describes a process for the fabricating a BiCMOS device, however this prior art does not describe the integration of the N type epitaxial layer, using a specific dopant level, needed to optimize bipolar performance, described in this present invention.

SUMMARY OF THE INVENTION

It is a principal object of this invention to design a BiCMOS structure which employs separate masks for the P well, as well as for the N well CMOS regions, while choosing the ideal N type epitaxial silicon layer for the NPN bipolar devices.

It is an object of this invention to integrate the fabrication of twin wells, a P well for the N type CMOS devices, and an N well for the P type CMOS devices, into the BiCMOS fabrication process.

It is another object of this invention to create a buried sub-collector region, for the bipolar device, while creating a buried N type layer, for the P type CMOS devices, using the same masking and ion implantation procedures.

It is still another object of this invention to integrate an N type, epitaxial layer, into the BiCMOS fabrication sequence, to be used as the collector region of the bipolar device.

It is still yet another object of this invention to use a split polysilicon layer, to protect the CMOS gate insulator layers from specific bipolar fabrication processes.

The design concept invention for BiCMOS is to form an N well region, for the P channel devices, and to form a P well region, for the N channel devices, and use an N type, epitaxial silicon layer for the NPN bipolar device. The N type epitaxial layer, in terms of dopant concentration, is specifically designed for the NPN bipolar devices. In prior BiCMOS designs the same N well, used for P channel devices, was used for the NPN bipolar device, particularly as CMOS fabrication is using a feature size of 0.25 uM, or less, and with an increased N well dopant concentration. The use of increased N well dopant concentration, for the NPN bipolar devices, is unsatisfactory, in terms of performance. In conventional BiCMOS designs the epitaxial layer, which could be either N type, or P type, is very low. However in this invention, using a feature size of 0.25 uM, or less, the epitaxial silicon layer must be N type, with the doping level designed to satisfy the NPN bipolar performance criteria. This will result in optimum CMOS, as well as NPN bipolar devices. In addition the process described in this present invention does not increase process steps or process complexity.

In accordance with the present invention a method of fabricating a BICMOS device, on a semiconductor substrate, featuring the use of an epitaxial silicon layer, for the bipolar device, and featuring the use of twin wells, for the CMOS devices, is described. After forming buried N type layers, in a first region of the semiconductor substrate, to be used for isolation of P type, (PFET), CMOS devices, and in a third region, to be used for the buried subcollector region, of the bipolar devices, a buried P type layer is formed in a second region of the semiconductor substrate, to be used for isolation of N type, (NFET), CMOS devices. An N type epitaxial silicon layer is grown, followed by the formation of an N well region, overlying the buried N type layer, in the first region, or in the PFET region, of the semiconductor substrate. After the creation of a heavily doped reach through region, contacting the buried subcollector layer, in the third region of the semiconductor substrate, a pattern in an oxidation resistant, composite layer, is formed on the regions of the semiconductor substrate, to be protected from a subsequent oxidation procedure, used to form isolation regions. After formation of a P well region, overlying the buried P type layer, in the second region, or in the NFET region of the semiconductor substrate, an oxidation procedure is performed, creating isolation regions, in areas not protected by the oxidation resistant, composite insulator layer, leaving subsequent active device regions, unoxidized.

Removal of the oxidation resistant, composite layer, is followed by the growth of a gate insulator layer, on the surface of all active device regions, followed by the deposition of a thin, first polysilicon layer. Conventional photolithographic and ion implantation procedures, are used to create a P type base region, in the collector region, located in the third region, or in the bipolar region, of the semiconductor substrate. Conventional photolithographic and dry etching procedures, are used to create an emitter opening in the thin, first polysilicon, followed by the formation of an N type, self-aligned collector region, ion implanted through the emitter opening, and located in the collector region, underlying the P type base region, and overlying the buried subcollector region. After removal of the gate insulator layer, exposed in the emitter opening, a thick, second polysilicon layer, is deposited, doped, and along with thin, first polysilicon layer, is patterned to create polysilicon gate structures, in the NFET and PFET regions, as well as creating a polysilicon emitter structure, contacting the base region, in the emitter opening. Conventional photolithographic block out masking, is used to allow a lightly doped, N type source/drain regions, to be formed in an area of the NFET region, not covered by the polysilicon gate structure, while similar photolithographic block out masking is used to allow a lightly doped, P type source/drain region to be formed in an area of the PFET region, not covered by a polysilicon gate structure. After formation of insulator spacers, on the sides of the polysilicon gate structures, and on the sides of the polysilicon emitter structure, an emitter drive-in cycle is performed, allowing dopant from the polysilicon emitter structure to diffuse into the top portion of the P type base region, creating an emitter region. Conventional photolithographic block out procedures, and conventional ion implantation procedures, are used to create the heavily doped N type, source/drain region, in an area of the NFET region, not covered by the polysilicon gate structure, or by the insulator spacers, followed by additional photolithographic block out masking, and ion implantation procedure, used to create the heavily doped, P type source/drain region, in an area of the PFET region, not covered by the polysilicon gate structure, or by insulator spacers.

BRIEF DESCRIPTION OF THE DRAWINGS

The object and other advantages of this invention are best explained in the preferred embodiment with reference to the attached drawings that include.

DESCRIPTION OF THE PREFERRED EMBODIMENTS

Figure 1:
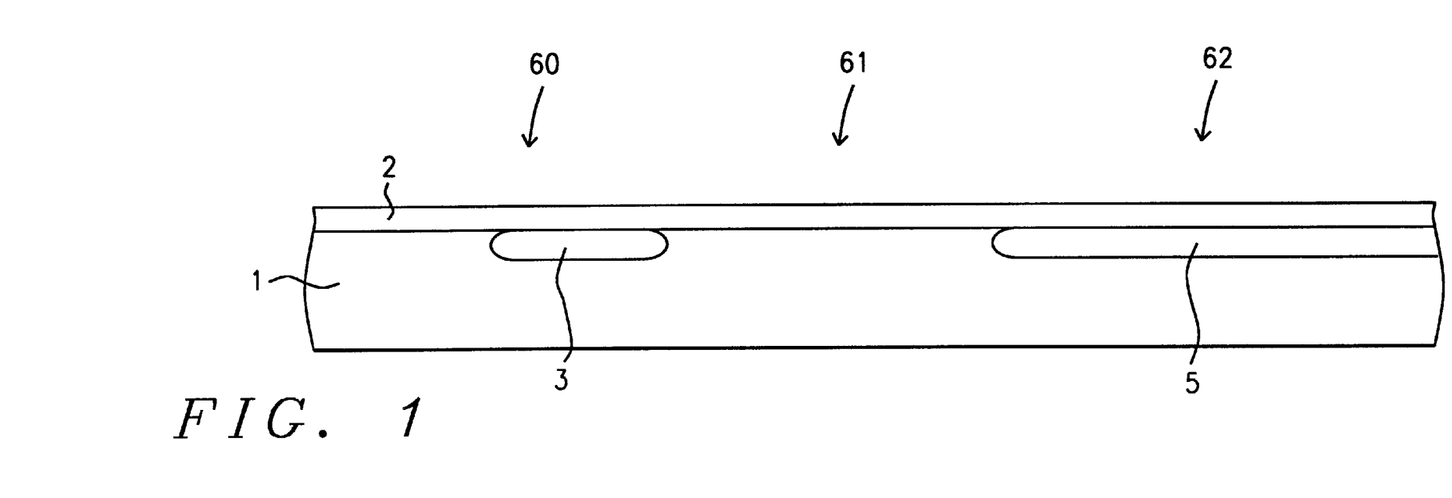
FIGS. 1–16, which schematically, in cross-sectional style, describe key stages of fabrication of a BiCMOS device, featuring twin wells, and an N type, epitaxial silicon layer.
Figure 2:
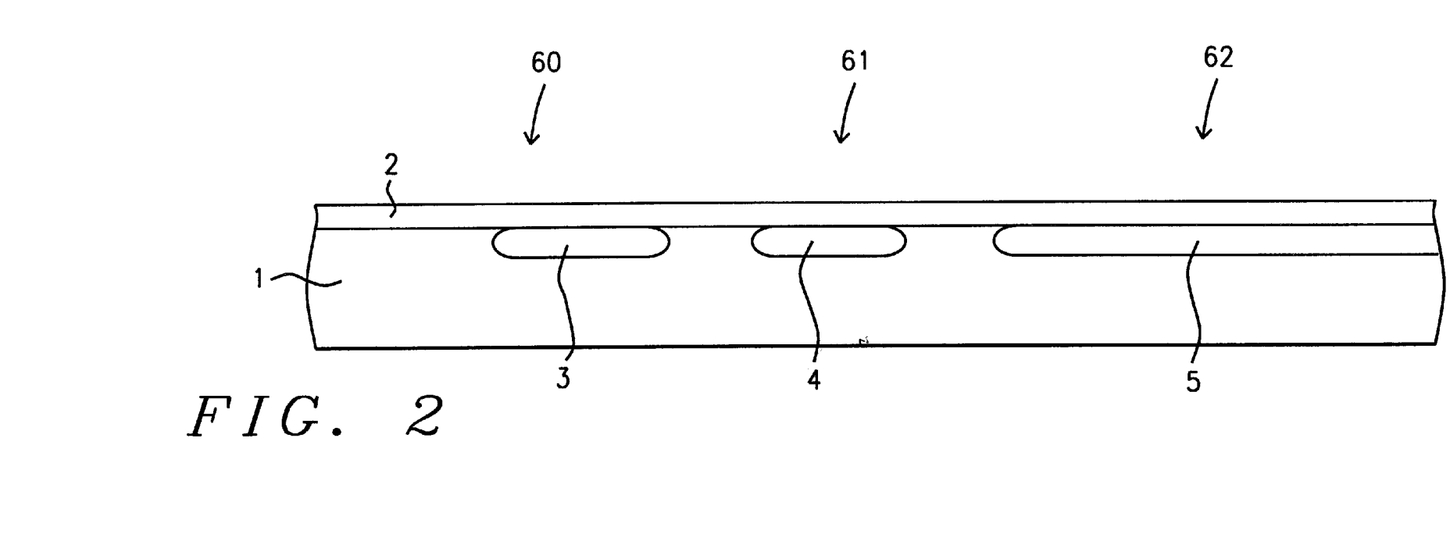
Figure 3:
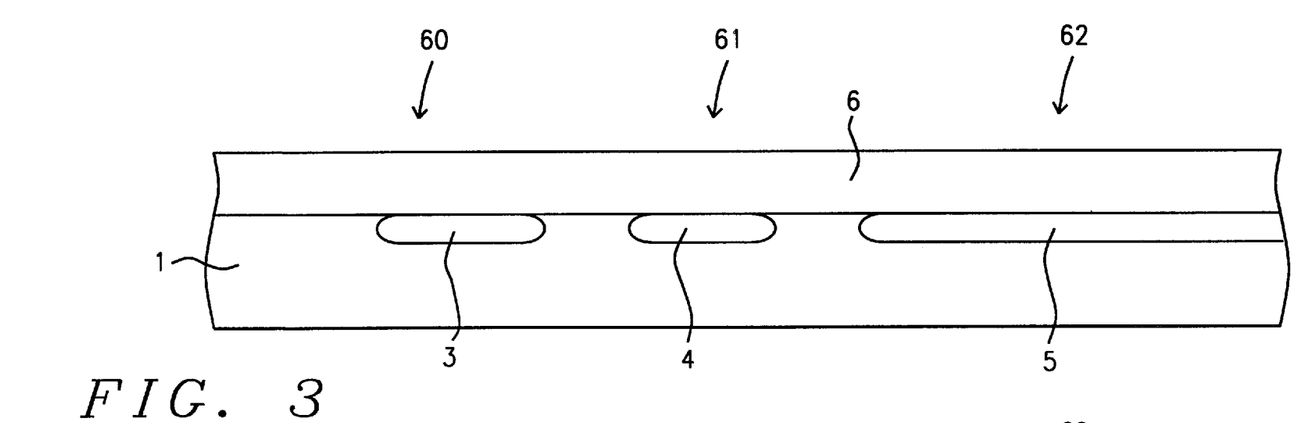

The process used to fabricate a BICMOS device, featuring an N type epitaxial silicon layer, for the bipolar components, and twin well regions, for the CMOS elements, will now be described in detail. A P type, single crystalline silicon substrate 1, with a <100> crystallographic orientation, and a resistivity between about 15 to 25 ohm-cm, is used, and shown schematically in FIG. 1. A silicon dioxide layer 2, to be used as a screen oxide layer, for subsequent ion implantation procedures, is thermally grown, to a thickness between about 120 to 160 Angstroms, on semiconductor substrate 1. Conventional photolithographic block out masking is next used, to allow N type buried layer 3, to be formed in region 60, and to allow N type buried subcollector 5, to be formed in region 62, of semiconductor substrate 1, with buried layer 3, used for the P type, of PFET, CMOS devices, while buried layer 5, is to be used for the bipolar device. The photoresist block out shape, (not shown in the drawings), protected region 61, to be used for the N type, of NFET, CMOS devices, from the buried layer, antimony, or arsenic, ion implantation procedure, performed at an energy between about 60 to 80 KeV, at a dose between about 4E15 to 6E15 atoms/cm². After removal of the photoresist block out shape, used to define N type buried layer 3, and N type buried subcollector layer 5, via plasma oxygen ashing and careful wet cleans, an anneal procedure, performed at a temperature between 1150 to 1200° C., for a time between about 50 to 70 min., is employed to finalize the N type buried layer regions. This is schematically shown in FIG. 1. Another photoresist block out shape, (not shown in the drawings), is next used to protect region 60, and region 62, from an ion implantation procedure, using boron ions, at an energy between about 30 to 70 KeV, and at a dose between about 5E12 to 5E13, to create P type, buried layer 4, in region 61, to be used for the NFET CMOS devices. After removal of the photoresist block out shape, used to create P type buried layer 4, via plasma oxygen ashing and careful wet cleans, another anneal cycle, performed at a temperature between about 875 to 925° C., for a time between about 25 to 35 min., is used to finalize P type, buried layer 4, schematically shown in FIG. 2. A hydrofluoric acid procedure is next used to remove silicon dioxide layer 2, followed by the growth of epitaxial layer 6, shown schematically in FIG. 3. N type, epitaxial silicon layer 6, is grown at a temperature between about 700 to 1150° C., to a thickness between about 1.0 to 1.5 uM, in a silane ambient, with the addition of arsenic, or phosphorous, to result in a surface concentration between about 1.0E16 to 3.0E16 atoms/cm³. The surface concentration of N type epitaxial silicon layer 6, about 1.6E16 atoms/cm², is needed to obtain the desired device characteristics of subsequently formed, bipolar devices.

Figure 4:
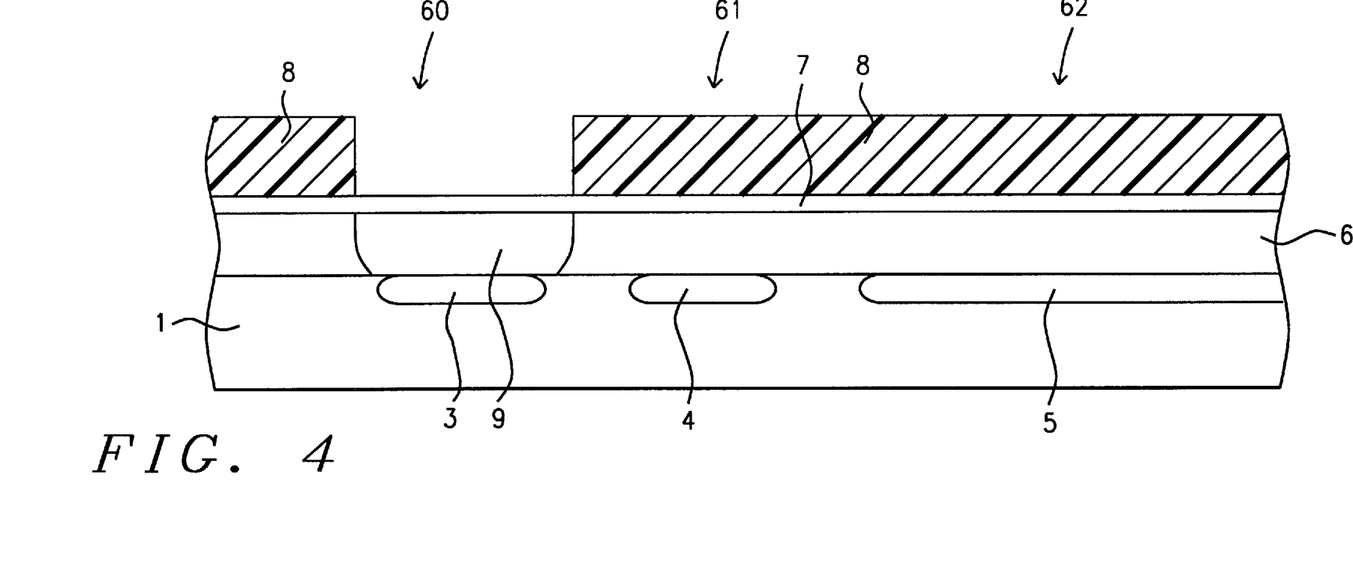
Figure 5:
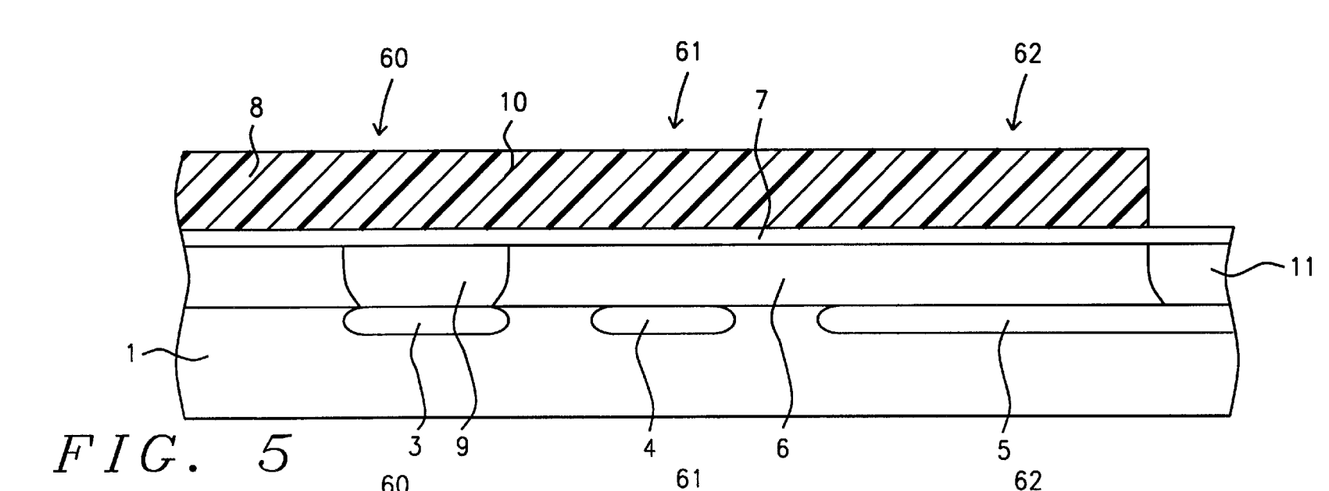

Silicon dioxide screen oxide layer 7, is next thermally grown, to a thickness between about 225 to 275 Angstroms, in an oxygen—steam ambient, at a temperature between about 910 to 930° C. Photoresist block out shape 8, is next used as a mask to allow N well region 9, shown schematically in FIG. 4, to be formed in PFET region 60, via ion implantation of phosphorous ions, at an energy between about 150 to 170 KeV, at a dose between about 3E12 to 5E12 atoms/cm². After removal of photoresist block out shape 8, via plasma oxygen ashing and careful wet cleans, photoresist block out shape 10, is formed, and used to allow the formation of N type, collector reach through region 11, to be created in a portion of N type epitaxial silicon layer 6. Collector reach through region 11, schematically shown in FIG. 5, is formed via a first ion implantation of phosphorous ions, at an energy between about 150 to 170 KeV, and at a dose between about 0.9E14 to 1.1E14 atoms/cm², followed by a second ion implantation procedure of phosphorous ions, at an energy between about 70 to 90 KeV, and at a dose between about 4E15 to 6E15 atoms/cm².

Figure 6:
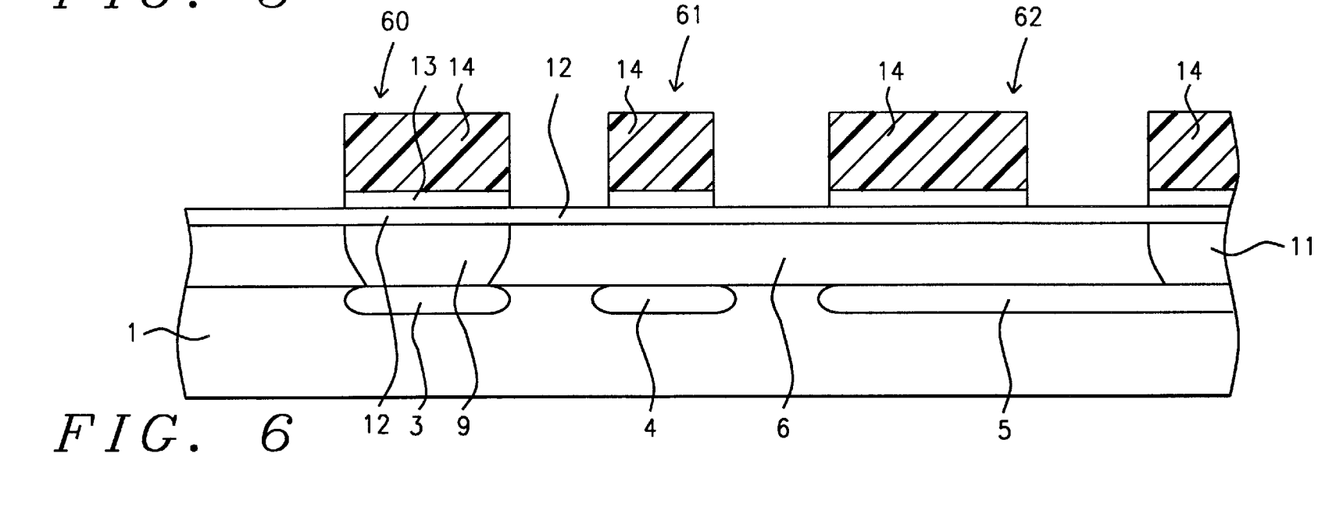
Figure 7:
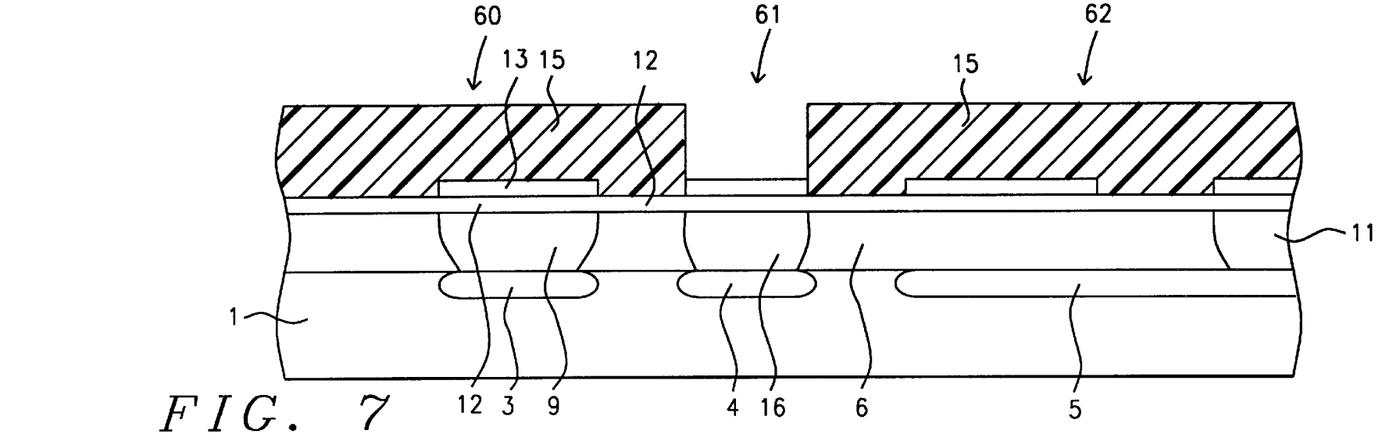
Figure 8:
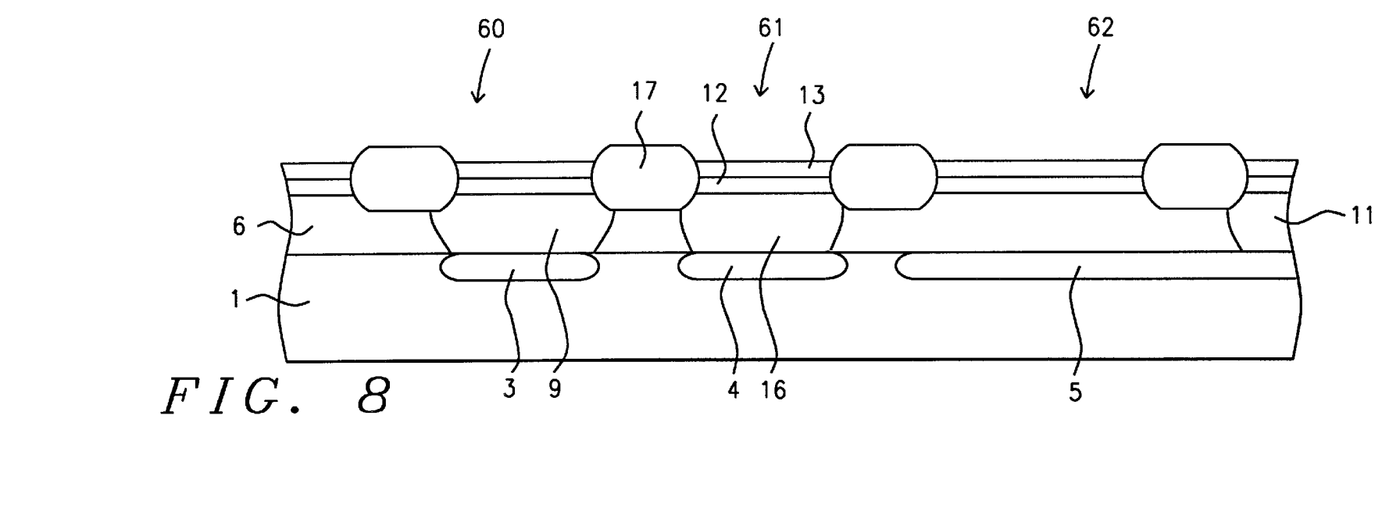

After removal of block out shape 10, via plasma oxygen ashing and careful wet cleans, and after the removal of silicon dioxide layer 7, via a buffered hydrofluoric acid procedure, silicon oxide pad layer 12, is thermally grown, to a thickness between about 325 to 375 Angstroms, in an oxygen—steam ambient, at a temperature between about 975 to 1025° C. A silicon nitride layer is next deposited, via low pressure chemical vapor deposition, (LPCVD), or plasma enhanced chemical vapor deposition, (PECVD), procedures, to a thickness between about 1400 to 1600 Angstroms. Photoresist shapes 14, are then used as a mask to create silicon nitride shapes 13, via an anisotropic RIE procedure, using $CHF_3$ and $CF_4$ as an etchant. This is schematically shown in FIG. 6. After removal of photoresist shapes 14, via plasma oxygen ashing and careful wet cleans, photoresist shape 15, is formed, and used as a block out mask to allow P well region 16, to be formed in NFET CMOS region 61, via a first ion implantation procedure, using boron ions, at an energy between about 25 to 35 KeV, at a dose between about 4E13 to 6E13 atoms/cm², and a second ion implantation procedure, again using boron ions, at an energy between about 150 to 170 KeV, at a dose between about 0.9E12 to 1.1E12 atoms/cm². This is schematically shown in FIG. 7. After removal of photoresist shape 15, via plasma oxygen ashing and careful wet cleans, an oxidation procedure is performed, in an oxygen—steam ambient, at a temperature between about 970 to 1000° C., to create silicon dioxide isolation regions 17, shown schematically in FIG. 8, in areas not protected by silicon nitride shapes 13. Silicon nitride shapes 13, protected subsequent CMOS, and bipolar, active device regions, from the LOCcalized Oxidation of Silicon, (LOCOS), procedure.

Figure 9:
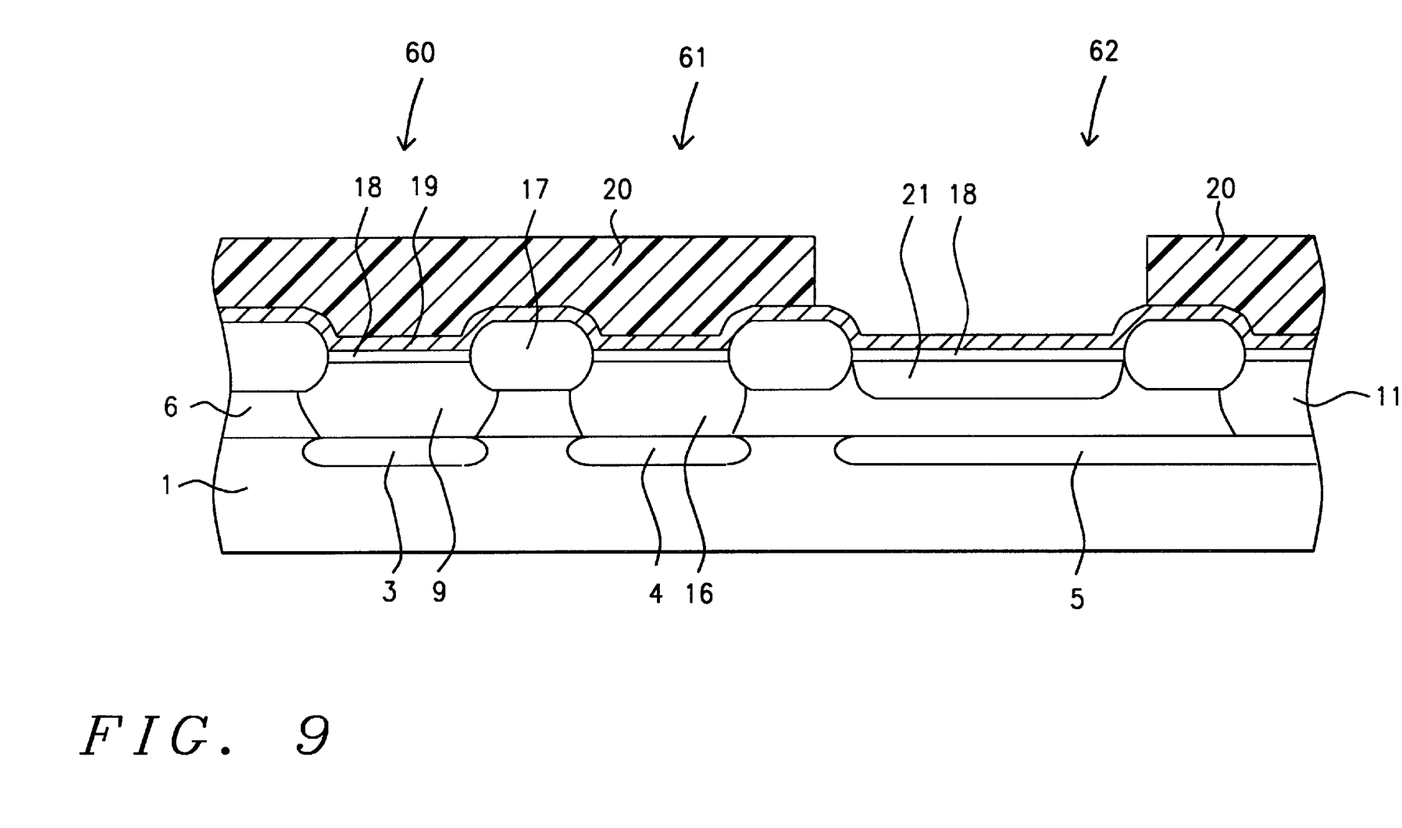

After removal of silicon nitride shapes, via use of a hot phosphoric acid solution, and the removal of silicon oxide pad layer 12, via use of a buffered hydrofluoric acid solution, silicon dioxide layer 18, is thermally grown, at a thickness between about 130 to 150 Angstroms, in an oxygen—steam ambient, at a temperature between about 910 to 930° C. Silicon dioxide layer 18, will be used as the gate insulator layer, in PFET CMOS region 60, and in NFET CMOS region 61, while silicon dioxide layer 18, schematically shown in FIG. 9. will be used as part of a base oxide layer, in bipolar region 62. A thin polysilicon layer 19, is next deposited via LPCVD procedures, to a thickness between about 450 to 550 Angstroms, using silane as a source, with thin polysilicon layer 19, to be used to protect silicon dioxide layer 18, located in the CMOS regions, from subsequent bipolar processing sequences. Photoresist shape 20, is then used as a mask, to allow an ion implantation procedure, using boron ions, at an energy between about 30 to 80 KeV, and at a dose between about 1E13 to 5E13 atoms/cm$^2$, to create base region 21, in bipolar region 62. This is schematically shown in FIG. 9.

Figure 10:
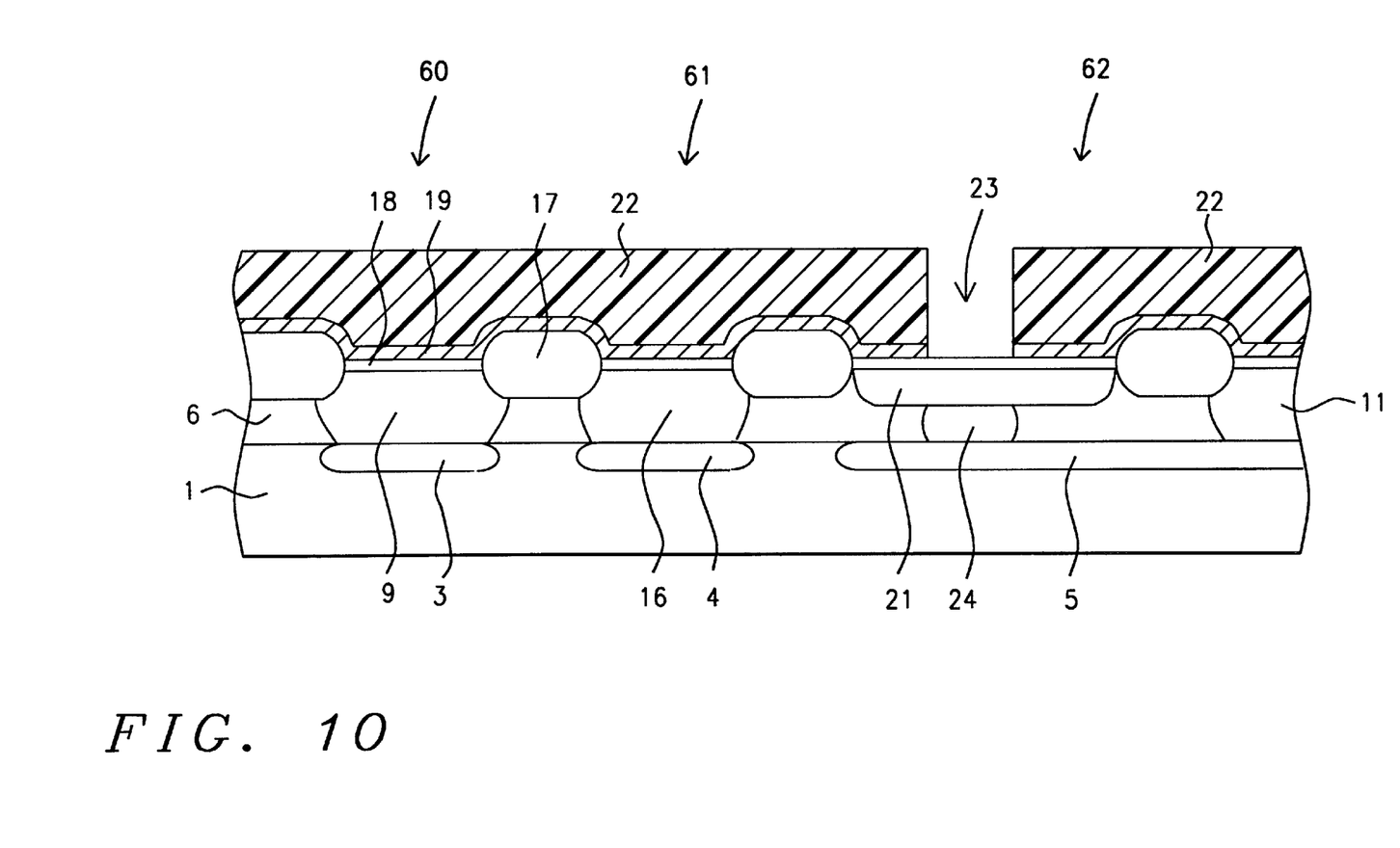

After removal of photoresist shape 20, using plasma oxygen ashing and careful wet cleans, photoresist shape 22, is formed, allowing emitter opening 23, shown schematically in FIG. 10. to be formed via an anisotropic RIE procedure, performed to thin polysilicon layer 19. A selective collector, (SIC), region 24, is next placed, underlying base region 21, and overlying N type buried subcollector region 5, using photoresist shape 22, as a mask, allowing an ion implantation procedure, using phosphorous ions, at an energy between about 200 to 500 KeV, at a dose between about 1.0E12 to 3.0E13 atoms/cm$^2$, to create SIC region 24. SIC region 24, with an N type doping level greater then the doping level of N type epitaxial silicon layer 6, restricts the width of a subsequent base width region, thus improving the performance of the bipolar device.

Figure 11:
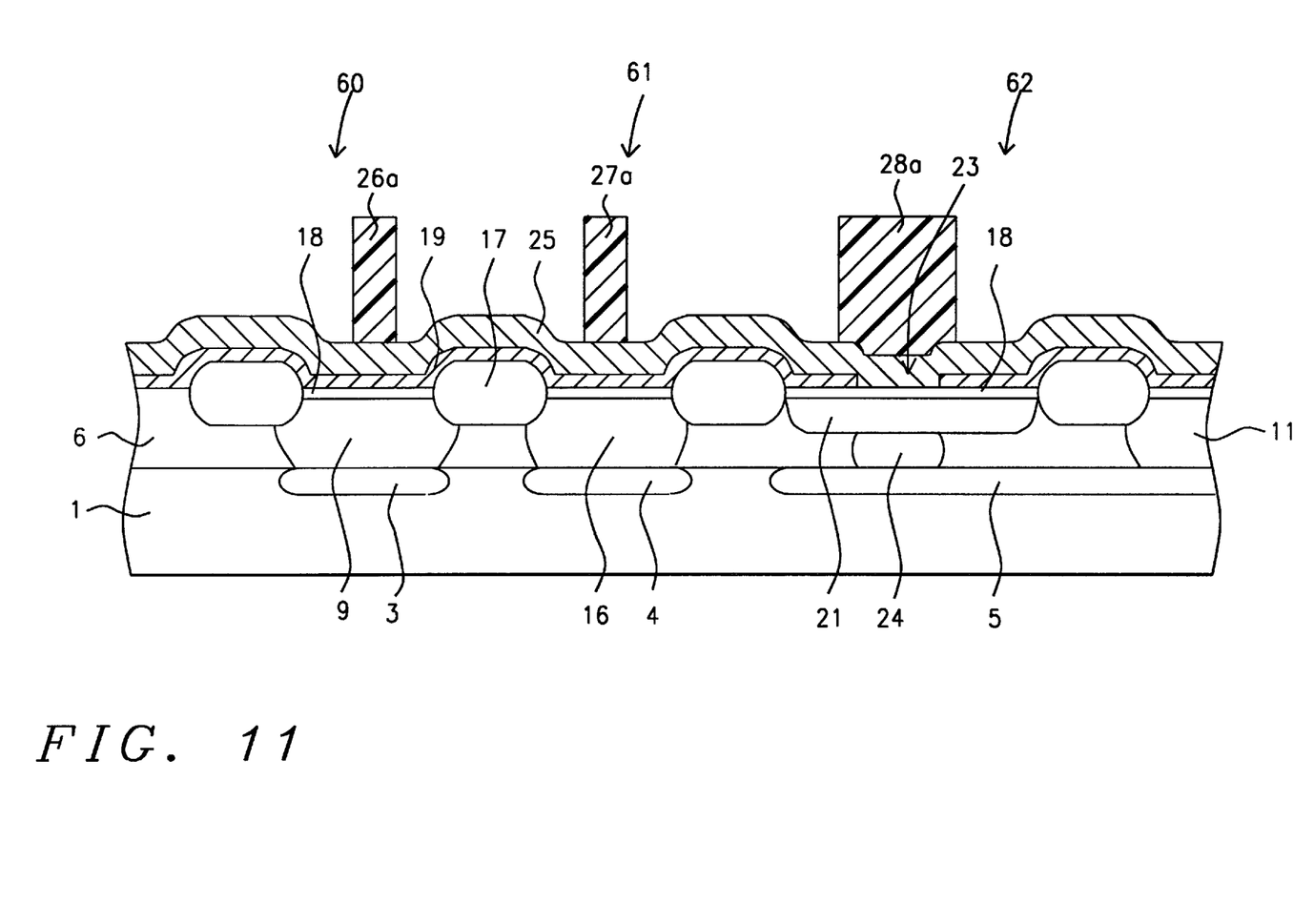

After removal of photoresist shape 22, again using plasma oxygen ashing and careful wet cleans, silicon dioxide layer 18, exposed in emitter opening 23, is removed using a buffered hydrofluoric acid solution. A thick polysilicon layer 25, shown schematically in FIG. 11, is deposited, via LPCVD procedures, to a thickness between about 2000 to 3500 Angstroms, overlying thin polysilicon layer 19, in all regions, except in emitter opening 23, in which thick polysilicon layer 25, directly contacts the exposed portion of base region 21. An ion implantation procedure, using arsenic ions, at an energy between about 40 to 80 KeV, and at a does between about 1E16 to 2E16 atoms/cm$^2$, is used to dope thick polysilicon layer 25. Photoresist shape 26a, and 27a, to be used as etch mask for subsequent CMOS gate structure definition, and photoresist shape 28a, to be used for emitter structure definition, are next formed on thick polysilicon layer 25. This is schematically shown in FIG. 11.

Figure 12:
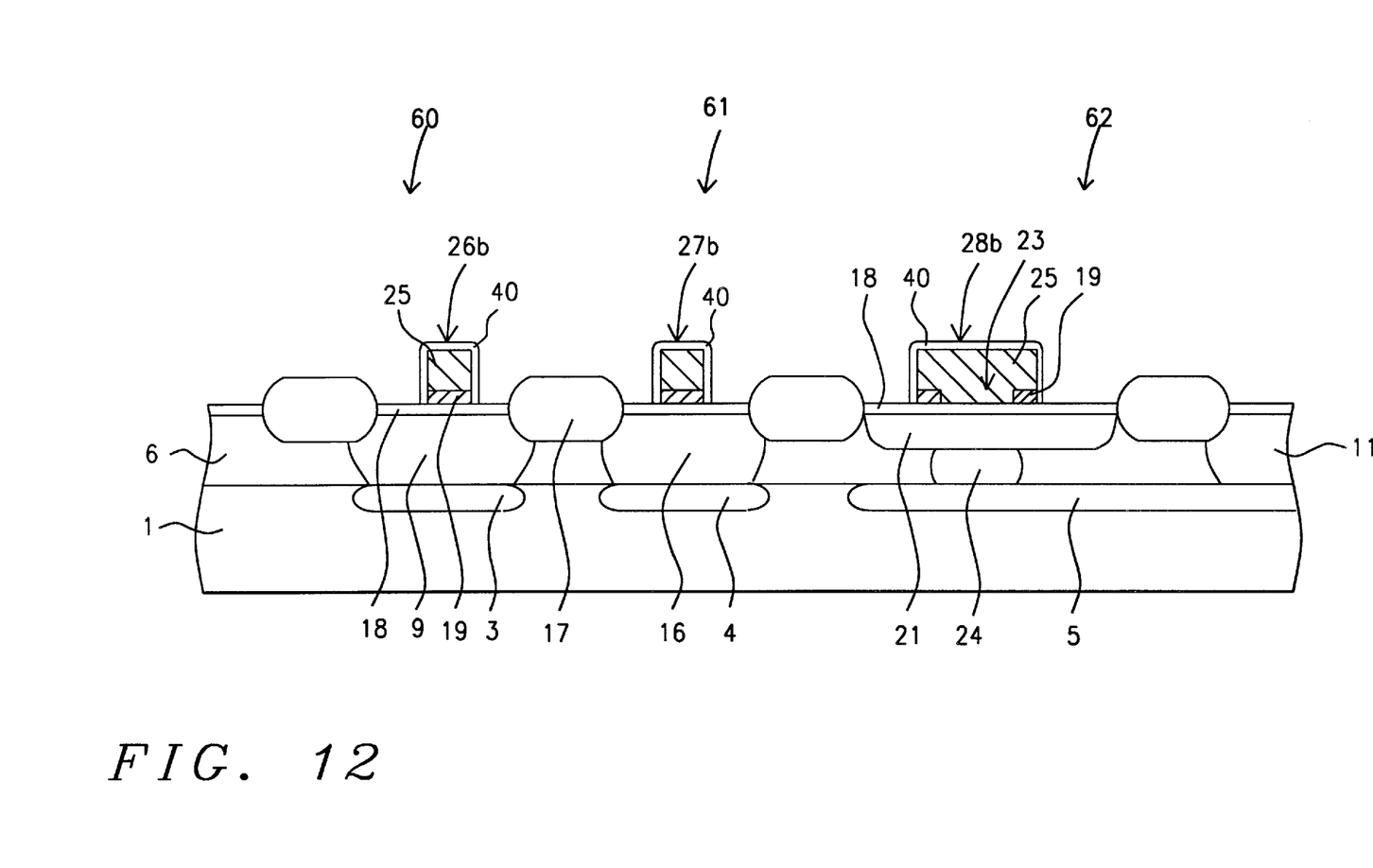

An anisotropic RIE procedure, using Cl$_2$ as an etchant, and using photoresist shapes 26a, 27a, and 28a, as etch masks, are used to define: PFET polysilicon gate structure 26b, comprised of thick polysilicon layer 25, and underlying thin polysilicon layer 19; NFET polysilicon gate structure 27b, comprised of thick polysilicon layer 25, and underlying thin polysilicon layer 19; and emitter structure 28b, comprised of thick polysilicon layer 25, contacting base region 21, in emitter opening 23, and comprised of underlying thin polysilicon layer 19, residing on silicon dioxide layer 18, in regions adjacent to emitter opening 23. This is schematically shown in FIG. 12. After removal of the photoresist shapes, used to define the gate structures and the emitter structure, via plasma oxygen ashing and careful wet cleans, an oxidation procedure, performed at a temperature between about 900 to 940° C., in an oxygensteam ambient, is used to create silicon oxide layer 40, at a thickness between about 80 to 100 Angstroms, on emitter structure 28b, as well as formation of silicon oxide layer 41, on exposed surfaces of the polysilicon gate structures. This is schematically shown in FIG. 12.

Figure 13:
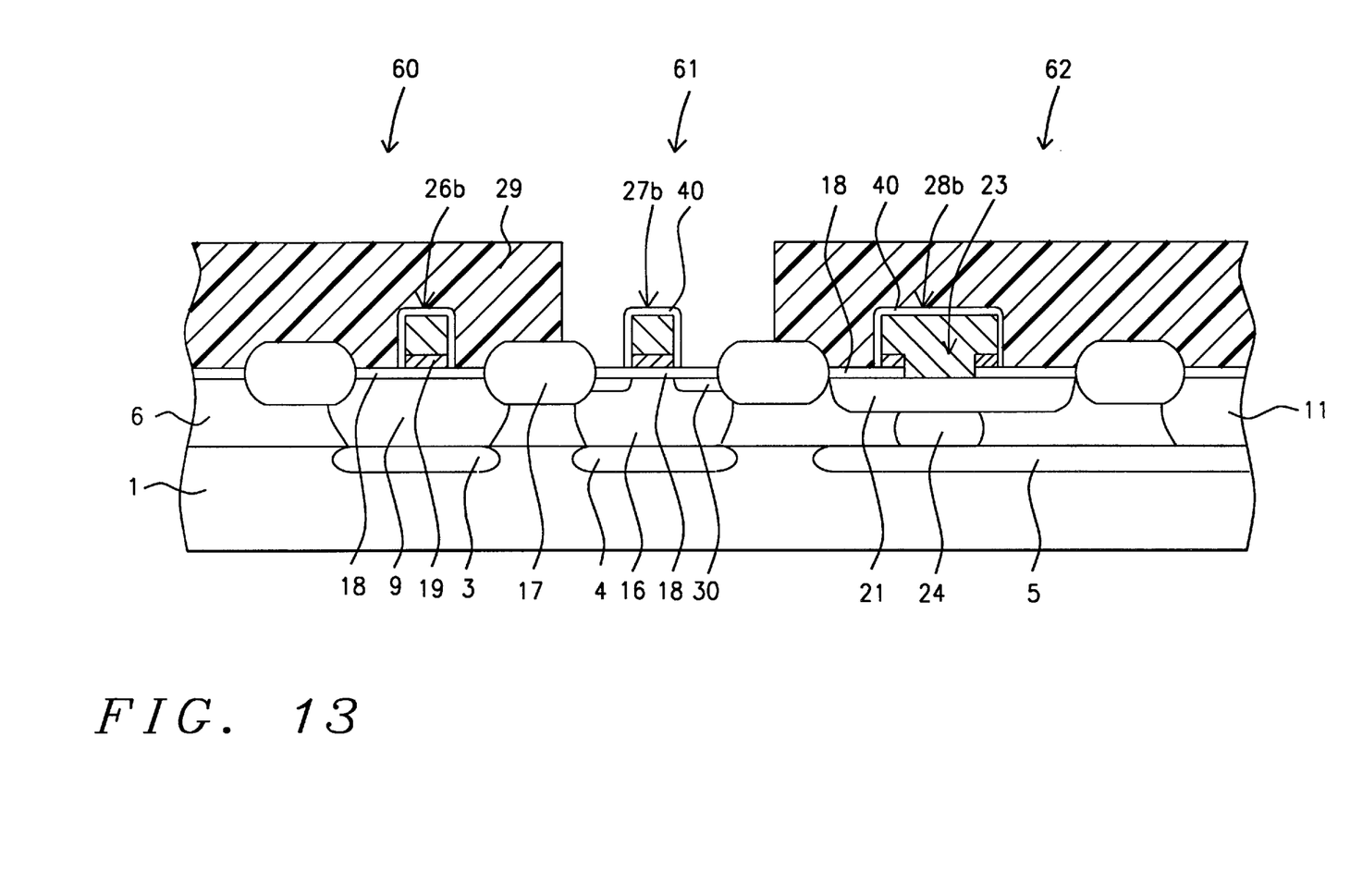
Figure 14:
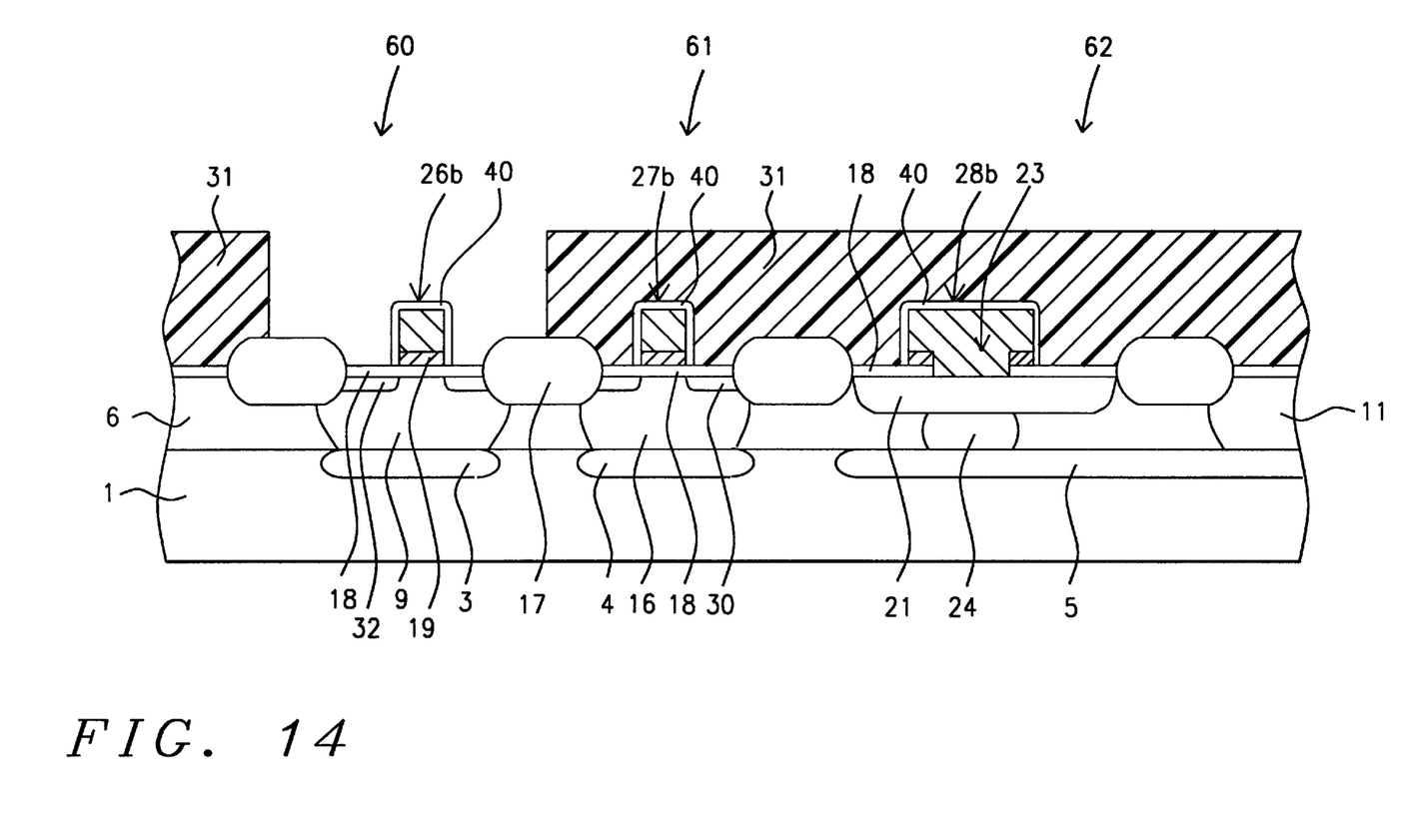

FIG. 13, schematically shows the formation of lightly doped, N type source/drain regions 30, in NFET CMOS region 61. Photoresist shape 29, is used to block out PFET CMOS region 60, and bipolar region 62, from an ion implantation procedure, using phosphorous ions at an energy between about 40 to 60 KeV, at a dose between about 1.4E13 to 1.6E13 atoms/cm$^2$, creating lightly doped, N type source/drain regions 30. After removal of photoresist shape 29, via plasma oxygen ashing and careful wet cleans, photoresist shape 31, is employed to block out NFET CMOS region 61, and bipolar region 62, from an ion implantation procedure, performed using BF$_2$ ions, at an energy between about 40 to 80 KeV, and at a dose between about 0.9E13 to 1.1E13 atoms/cm$^2$, creating lightly doped, P type source/drain regions 32, in PFET CMOS region 60. This is schematically shown in FIG. 14.

Figure 15:
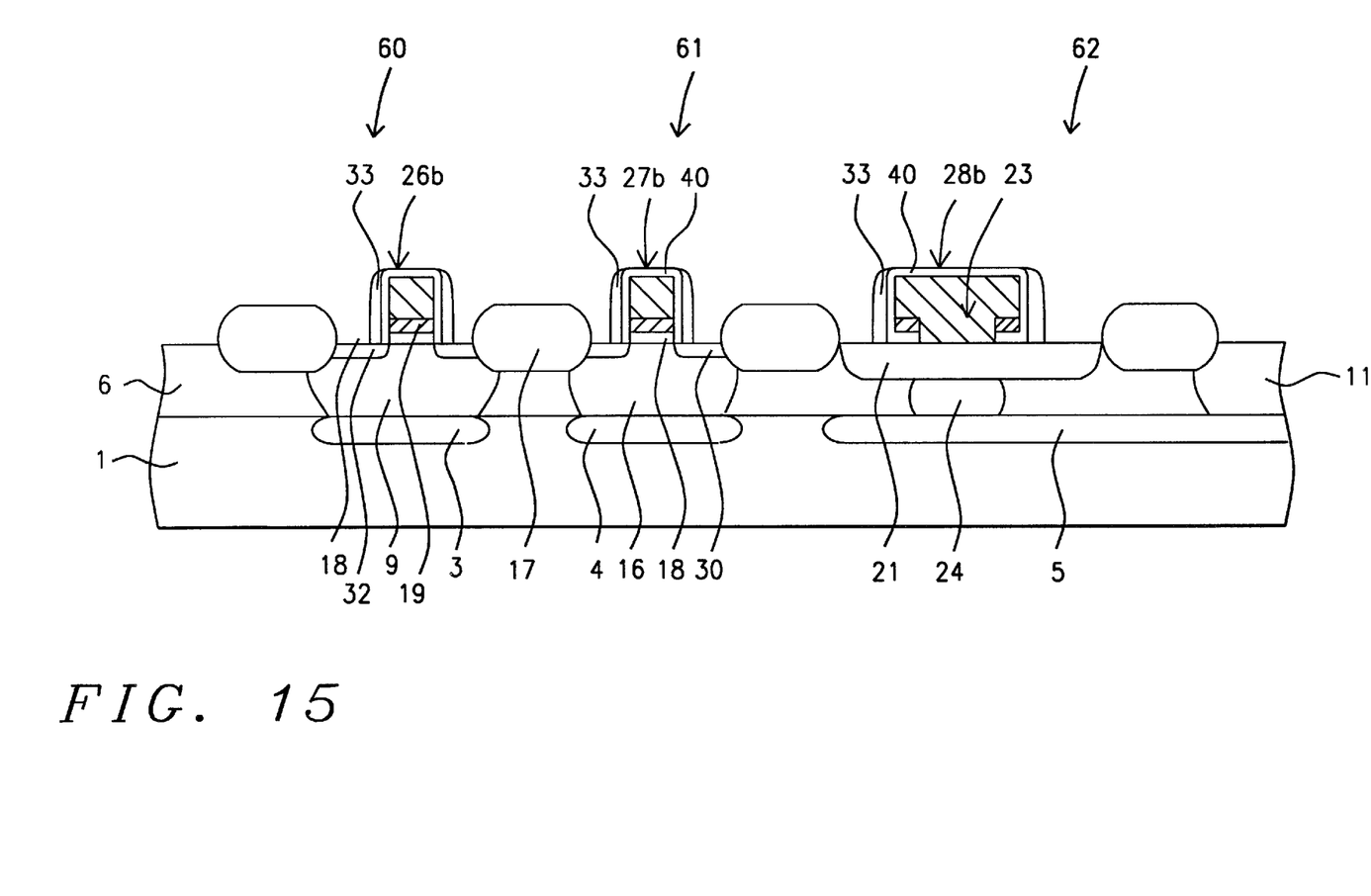

After removal of photoresist shape 31, via plasma oxygen ashing and careful wet cleans, a deposition of silicon oxide, is achieved via LPCVD or PECVD procedures, at a thickness between about 2500 to 3500 Angstroms, using tetraethylorthosilicate, (TEOS), as a source. An anisotropic RIE procedure, using CHF$_3$ as an etchant, is used to create silicon oxide spacers 33, on the sides of the polysilicon gate structures, as well as on the sides of the emitter structure. This is schematically shown in FIG. 15.

Figure 16:
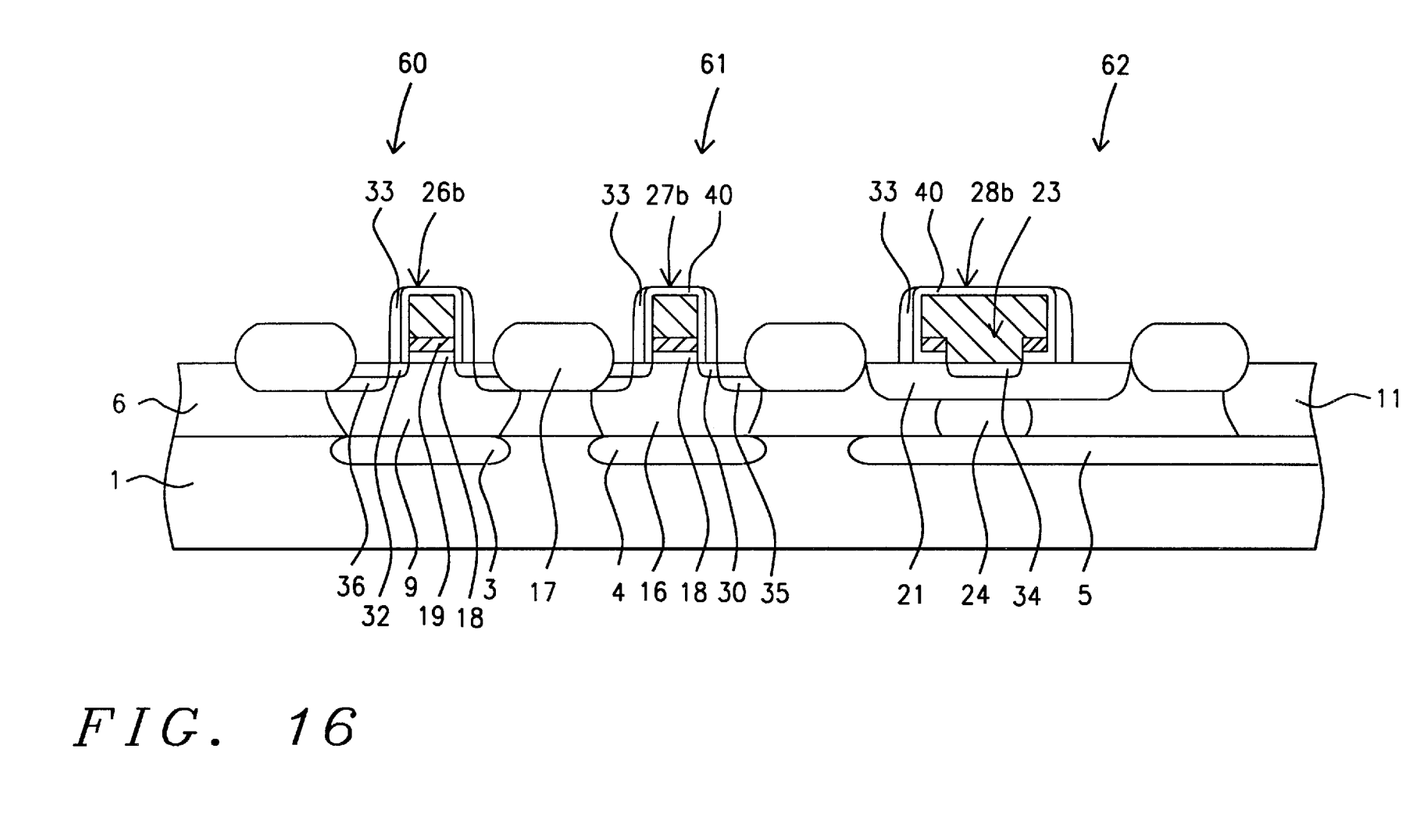

FIG. 16, schematically shows heavily doped, N type source drain region 35, in NFET CMOS region 61, as well as P type, heavily doped source/drain region 36, in PFET CMOS region 60. First a photoresist block out shape, (not shown in the drawings), is used to protect PFET CMOS region 60, and bipolar region 62, from an ion implantation procedure, using arsenic ions, at an energy between about 60 to 80 Kev, at a dose between about 5E15 to 7E15 atoms/cm$^2$, creating heavily doped, N type source/drain region 35. After removal of the NFET photoresist block out shape, photoresist shape, (not shown in the drawings), is formed, and used to block out NFET CMOS region 61, and bipolar region 62, from an ion implantation procedure, performed using BF$_2$ ions, at an energy between 40 to 60 Kev, and at a dose between about 4E15 to 6E15 atoms/cm$^2$, to create heavily doped, P type source drain region 36. The photoresist block out shape is again removed using plasma oxygen ashing and careful wet cleans.

A rapid thermal anneal, (RTA), procedure is next performed at a temperature between about 1000 to 1060° C., for a time between about 5 to 20 sec., to drive dopant from emitter structure 28b, into an area of P type base region 21, exposed in emitter opening 23, creating emitter region 34, located in a top portion of P type base region 21. This is schematically shown in FIG. 16. The space between emitter region 34, and SIC region 24, is the base width of the NPN bipolar device.

Creation of metal contact structures, (not shown in the drawings), to underlying elements of the CMOS and bipolar devices, are formed in contact holes, created in conventional passivation layers, such as boro-phosphosilicate glass, (BPSG). Metal interconnect structures are formed in via holes, created in an interlevel dielectric layer, with the metal interconnect structure, overlying and contacting the underlying metal contact structure.

An additional embodiment of this invention, can be a third well, an N well, located in bipolar region 62, used to modify the dopant concentration of N type epitaxial silicon layer 6.

While this invention has been particularly shown and described with reference to the preferred embodiments thereof, it will be understood by those skilled in the art that various changes in form and details may be made without departing from the spirit and scope of this invention.

What is claimed is:

1. A method of fabricating a BiCMOS device, on a semiconductor substrate, comprising the steps of:

forming a first buried layer, of a first conductivity type, in a first region of the semiconductor substrate, to be used as a PFET CMOS region, forming a second buried layer, of said first conductivity type, in a third region of said semiconductor substrate, to be used as bipolar device region, and forming a third buried layer, of a second conductivity type, in a second region of said semiconductor substrate to be used as an NFET CMOS region;

growing an epitaxial silicon layer, containing said first conductivity type;

forming a first well region, of a first conductivity type, in a region of said epitaxial silicon layer, directly overlying said first buried layer, forming a second well region, of a second conductivity type, in a region of said epitaxial silicon layer, directly overlying said third buried layer, and forming a doped region, of first conductivity type, in a region of said epitaxial silicon layer, overlying a portion of said second buried layer;

forming a first insulator isolation region, in region of said semiconductor substrate, located between said first region, and said second region, of said semiconductor substrate, and forming a second insulator isolation region, located between said second region, and said third region, of said semiconductor substrate;

growing a first silicon oxide layer on regions of the top surface of said semiconductor substrate, not covered by insulator isolation regions;

depositing a first polysilicon layer;

forming a base region, of a second conductivity type, in a region of said epitaxial layer, located in said third region of said semiconductor substrate;

forming an emitter opening in said first polysilicon layer, in said third region of said semiconductor substrate, and creating a self-aligned collector, (SIC), region, of said first conductivity type, self aligned to said emitter opening, and with said SIC region located underlying said base region, and overlying said second buried layer;

removing portion of said first silicon oxide layer, exposed in said emitter opening;

depositing a second polysilicon layer, and doping of said second polysilicon layer with a dopant of said first conductivity type;

patterning of said second polysilicon layer, and of said first polysilicon layer to create: a first polysilicon gate structure, on said first silicon oxide layer, in said first region of said semiconductor substrate; a second polysilicon gate structure, on said first silicon oxide layer, in said second region of said semiconductor substrate; and a polysilicon emitter structure, contacting a portion of said base region, exposed in said emitter opening, in said third region of said semiconductor substrate;

growing a second silicon oxide layer on exposed surfaces: of said first polysilicon gate structure; of said second polysilicon gate structure; and of said polysilicon emitter structure;

forming a lightly doped source/drain region, of a first conductivity type, in an area of said second region of said semiconductor substrate, not covered by said second polysilicon gate structure, and forming a lightly doped source/drain region, of a second conductivity type, in an area of said first region of said semiconductor substrate, not covered by said first polysilicon layer;

forming insulator spacers on the sides of said first polysilicon gate structure, on the sides of said second polysilicon gate structure, and on the sides of said polysilicon emitter structure;

forming a heavily doped source/drain region, of a first conductivity type, in an area of said second region of said semiconductor substrate, not covered by said second polysilicon gate structure, or by said insulator spacers;

forming a heavily doped source/drain region, of a second conductivity type, in an area of said first region of said semiconductor substrate, not covered by said first polysilicon gate structure, and not covered by said insulator spacers; and performing an anneal cycle to create an emitter region, of a first conductivity type, in a top portion of said base region, in said third region of said semiconductor substrate.

2. The method of claim 1, wherein said first buried layer, used for isolation purposes for said PFET CMOS device, and said second buried region, used as a subcollector region, for said bipolar device, are N type regions, formed via ion implantation of antimony or arsenic ions, at an energy between about 60 to 80 KeV, at a dose between about 4E15 to 6E15 atoms/cm$^2$, followed by an anneal procedure, performed at a temperature between about 1150 to 1200° C., for a time between about 50 to 120 min.

3. The method of claim 1, wherein said third buried layer, used for isolation purposes for said NFET CMOS device, is a P type region, formed via ion implantation of boron ions, at an energy between about 30 to 70 KeV, at a dose between about 5E12 to 5E13 atoms/cm$^2$, followed by an anneal procedure, performed at a temperature between about 875 to 925° C., for a time between about 25 to 35 min.

4. The method of claim 1, wherein said epitaxial silicon layer, is an N type epitaxial silicon layer, grown at a temperature between about 700 to 1150° C., to a thickness between about 1.0 to 1.5 uM, in a silane ambient, with the addition of arsenic or phosphorous, resulting in a dopant concentration between about 1.0 to 3.016 atoms/cm$^3$.

5. The method of claim 1, wherein said first well region, in said PFET CMOS region, is an N well region, formed via ion implantation of phosphorous ions, at an energy between about 150 to 170 KeV, at a dose between about 3E12 to 5E12 atoms/cm$^2$.

6. The method of claim 1, wherein said second well region, in said NFET CMOS region, is a P well region, formed via a first ion implantation procedure, using boron ions, at an energy between about 25 to 35 Kev, at a dose between about 4E13 to 6E13 atoms/cm$^2$, followed by a second ion implantation procedure, using boron ions, performed at an energy between about 150 to 170 KeV, at a dose between about 0.9E12 to 1.1E12 atoms/cm$^2$.

7. The method of claim 1, wherein said first silicon oxide layer, used as the gate insulator layer for CMOS devices, is a silicon dioxide layer, thermally grown to a thickness between about 130 to 150 Angstroms, in an oxygen—steam ambient, at a temperature between about 910 to 930° C.

8. The method of claim 1, wherein said first polysilicon layer is obtained via LPCVD procedures, at a thickness between about 450 to 550 Angstroms, using silane as a source.

9. The method of claim 1, wherein said base region, located in said bipolar device region, is formed via ion implantation of boron, at an energy between about 30 to 80 KeV, at a dose between about 1.0E13 to 5.0E13 atoms/cm$^2$.

10. The method of claim 1, wherein said SIC region, created self-aligned to said emitter opening, and located underlying said base region, and overlying said second buried layer region, is formed via ion implantation of phosphorous ions, at an energy between about 200 to 500 KeV, at a dose between about 1.0E12 to 3.0E13 atoms/cm$^2$.

11. The method of claim 1, wherein said second polysilicon layer is obtained via LPCVD procedures, at a thickness between about 2000 to 3590 Angstroms, and doped via an ion implantation procedure, using arsenic ions, at an energy between about 40 to 80 KeV, at a dose between about 1E16 to 2E16 atoms/cm$^2$.

12. The method of claim 1, wherein said first polysilicon gate structure, said second polysilicon gate structure, and said polysilicon emitter structure, are formed via an anisotropic RIE procedure, performed to said second polysilicon layer, and to said first polysilicon layer, using $Cl_2$ as an etchant.

13. The method of claim 1, wherein said second silicon oxide layer, is formed via thermal oxidation procedures, to a thickness between about 80 to 100 Angstroms.

14. The method of claim 1, wherein said emitter region is formed in a top portion of said base region, via an RTA procedure, performed at a temperature between about 1000 to 1060° C., for a time between about 5 to 20 sec.

15. A method of fabricating a BiCMOS device, on a semiconductor substrate, with said BiCMOS device comprised of NFET, and PFET, CMOS devices, and comprised of an NPN bipolar junction transistor, all formed in, and on, an N type, epitaxial silicon layer, comprising the steps of:

forming a buried N type layer, in a region of said semiconductor substrate to be used as a PFET CMOS region;

forming a N type subcollector region, in a region of said semiconductor substrate, to be used as a bipolar device region;

forming a buried P type region, in a region of said semiconductor substrate to be used as an NFET CMOS region;

growing said N type epitaxial silicon layer, on the top surface of said semiconductor substrate;

forming an N well region, in a first area of said N type epitaxial silicon layer, with said N well region overlying, and contacting, said N type buried layer;

forming a N type reach through region, in a second area of said N type epitaxial silicon layer, with said N type reach through region, overlying and contacting a first portion of said N type subcollector region;

forming a P well region, in a third area of said N type epitaxial silicon layer, with said P well region overlying, and contacting, said buried P type layer;

forming a first silicon dioxide isolation region, in a region of said semiconductor substrate located between said PFET CMOS region, and NFET CMOS region, and forming a second silicon dioxide isolation region, in a region of said semiconductor substrate located between said NFET CMOS region and said bipolar device region;

growing a silicon dioxide gate insulator layer on regions of said semiconductor substrate, exposed between silicon dioxide isolation regions;

depositing a thin polysilicon layer;

forming a P type base region, in a top portion of said N type epitaxial silicon layer, in a region in which said N type epitaxial silicon layer, overlays a second portion of said N type subcollector region;

forming an emitter opening in said thin polysilicon layer, exposing a portion of said silicon dioxide gate insulator layer, residing on underlying P type base region;

forming an N type self-aligned collector, (SIC), region, in a bottom portion of said N type epitaxial silicon layer, located underlying said P type base region, and overlying a portion of said N type subcollector region, and with said N type SIC region, self-aligned to overlying, said emitter opening;

removing the portion of said silicon dioxide gate insulator layer, exposed in said emitter opening;

depositing a thick polysilicon layer;

doping of said thick polysilicon layer;

patterning of said thick polysilicon layer, and of said thin polysilicon layer: to form a first polysilicon gate structure, on said silicon dioxide gate insulator layer, in said PFET CMOS region; to form a second polysilicon gate structure, on said silicon dioxide gate insulator layer, in said NFET CMOS region; and to form a polysilicon emitter structure, overlying and contacting a portion of said P type base region, exposed in said emitter opening;

growing a silicon oxide layer on the exposed surfaces: of said first polysilicon gate structure; of said second polysilicon gate structure; and of said polysilicon emitter structure;

forming a lightly doped, P type source/drain region, in an area of said PFET CMOS region, not covered by said first polysilicon gate structure;

forming a lightly doped, N type source/drain region, in an area of said NFET CMOS region, not covered by said second polysilicon gate structure;

forming insulator spacers on: the sides of said first polysilicon gate structure; the sides of said second polysilicon gate structure; and on the sides of said polysilicon emitter structure;

forming a heavily doped, P type source/drain region, in an area of said PFET CMOS region, not covered by said first polysilicon gate structure, or by said insulator spacers;

forming a heavily doped, N type source/drain region, in an area of said NFET CMOS region, not covered by said second polysilicon gate structure, of by said insulator spacers; and performing an emitter anneal cycle, creating an emitter region in a top portion of said P type base region, exposed in emitter opening, resulting in a P type base width, located between overlying, said emitter region, and underlying, said N type SIC region.

16. The method of claim 15, wherein said N type subcollector region, is formed via ion implantation of antimony or arsenic ions, at an energy between about 60 to 80 KeV, at a dose between about 4E15 to 6E15 atoms/cm$^2$, and via an anneal procedure, performed at a temperature between about 1150 to 1200° C., for a time between about 50 to 120 min.

17. The method of claim 15, wherein said N type epitaxial silicon layer, is grown at a temperature between about 700 to 1150° C., to a thickness between about 1.0 to 1.5 uM, using silane with the addition of arsine, or phosphorous, to result in a surface concentration, for said N type epitaxial silicon layer, between about 1E16 to 3E16 atoms/cm$^3$.

18. The method of claim 15, wherein said N well region, in said PFET CMOS region, is formed via an ion implantation procedure, using phosphorous ions, at an energy between about 150 to 170 KeV, at a dose between about 3E12 to 5E12 atoms/cm$^2$.

19. The method of claim 15, wherein said P well region, in said NFET CMOS region, is formed via a first ion implantation procedure, using boron ions, at an energy between about 25 to 35 KeV, at a dose between about 4E13 to 6E13 atoms/cm$^2$, and via a second ion implantation procedure, using boron ions, at an energy between about 150 to 170 KeV, at a dose between about 0.9E12 to 1.1E12 atoms/cm$^2$.

20. The method of claim 15, wherein said N type, reach through region, is formed via a first ion implantation procedure, using phosphorous ions, at an energy between about 150 to 170 KeV, at a dose between about 0.9E14 to 1.1E14 atoms/cm$^2$, and via a second ion implantation procedure, using phosphorous ions, at an energy between about 70 to 90 KeV, at a dose between about 4E15 to 6E15 atoms/cm$^2$.

21. The method of claim 15, wherein said silicon dioxide gate insulator layer, is thermally grown, to a thickness between about 130 to 150 Angstroms, in an oxygen—steam ambient, at a temperature between about 910 to 930° C.

22. The method of claim 15, wherein said thin polysilicon layer is obtained via LPCVD procedures, at a thickness between about 450 to 550 Angstroms, using silane as a source.

23. The method of claim 15, wherein said P type base region is formed via an ion implantation procedure, using boron ions, at an energy between about 30 to 80 KeV, and at a dose between about 1E13 to 5E13 atoms/cm$^2$.

24. The method of claim 15, wherein said N type SIC region, is formed via an ion implantation procedure, using phosphorous ions, at an energy between about 200 to 500 KeV, at a dose between about 1E12 to 3E13 atoms/cm$^2$.

25. The method of claim 15, wherein said thick polysilicon layer is obtained via LPCVD procedures, at a thickness between about 2000 to 3500 Angstroms, and doped via an ion implantation procedure, using arsenic ions, at an energy between about 40 to 80 KeV, at a dose between about 1E16 to 2E16 atoms/cm$^2$.

26. The method of claim 15, wherein said polysilicon emitter structure, said first polysilicon gate structure, and said second gate structure, are formed via an anisotropic RIE procedure, applied to said thick polysilicon layer, and to said thin polysilicon layer, using Cl$_2$ as an etchant.

27. The method of claim 15, wherein said silicon oxide layer, thermally grown on the exposed surfaces of said polysilicon emitter structure, and of polysilicon gate structures, at a temperature between about 900 to 940° C., is between about 80 to 100 Angstroms, in thickness.

28. The method of claim 15, wherein said insulator spacers are comprised of silicon oxide, or silicon nitride, at a thickness between about 2500 to 3500 Angstroms.

29. The method of claim 15, wherein said emitter anneal cycle, is performed using a RTA procedure, at a temperature between about 1000 to 1060° C., for a time between about 5 to 20 sec.

* * * * *